United States Patent
Shao et al.

(10) Patent No.: US 11,515,233 B2
(45) Date of Patent: Nov. 29, 2022

(54) SEMICONDUCTOR COMPONENT WITH COOLING STRUCTURE

(71) Applicant: Taiwan Semiconductor Manufacturing Co., Ltd., Hsinchu (TW)

(72) Inventors: Tung-Liang Shao, Hsinchu (TW); Lawrence Chiang Sheu, Hsinchu (TW); Chih-Hang Tung, Hsinchu (TW); Chen-Hua Yu, Hsinchu (TW); Yi-Li Hsiao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 294 days.

(21) Appl. No.: 16/869,594

(22) Filed: May 8, 2020

(65) Prior Publication Data

US 2021/0098336 A1    Apr. 1, 2021

Related U.S. Application Data

(60) Provisional application No. 62/906,711, filed on Sep. 26, 2019.

(51) Int. Cl.
   *H01L 23/473*  (2006.01)
   *H01L 23/467*  (2006.01)

(52) U.S. Cl.
   CPC .......... *H01L 23/473* (2013.01); *H01L 23/467* (2013.01)

(58) Field of Classification Search
   None
   See application file for complete search history.

(56) References Cited

U.S. PATENT DOCUMENTS

| | | | | |
|---|---|---|---|---|
| 5,349,831 A | * | 9/1994 | Daikoku | H01L 23/427 165/80.4 |
| 6,223,810 B1 | * | 5/2001 | Chu | F28D 15/0266 257/E23.099 |
| 2001/0020365 A1 | * | 9/2001 | Kubo | H05K 7/20309 257/E23.099 |
| 2004/0104022 A1 | * | 6/2004 | Kenny | F28F 13/06 257/E23.098 |
| 2009/0014156 A1 | * | 1/2009 | Vetrovec | H01L 23/473 165/104.31 |
| 2012/0180979 A1 | * | 7/2012 | Harrington | H05K 7/20272 165/96 |
| 2013/0068442 A1 | * | 3/2013 | Di Stefano | F28F 27/00 165/287 |

* cited by examiner

*Primary Examiner* — Evren Seven
(74) *Attorney, Agent, or Firm* — JCIPRNET (57) ABSTRACT

An apparatus includes a semiconductor component and a cooling structure. The cooling structure is over a back side of the semiconductor component. The cooling structure includes a housing, a liquid delivery device and a gas exhaust device. The housing includes a cooling space adjacent to the semiconductor component. The liquid delivery device is connected to an inlet of the housing and is configured to deliver a liquid coolant into the cooling space from the inlet. The gas exhaust device is connected to an outlet of the housing and is configured to lower a pressure in the housing.

6 Claims, 8 Drawing Sheets

SEMICONDUCTOR COMPONENT WITH COOLING STRUCTURE

CROSS-REFERENCE TO RELATED APPLICATION

This application claims the priority benefit of U.S. provisional application Ser. No. 62/906,711, filed on Sep. 26, 2019. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. However, the heat dissipation is a challenge in a variety of semiconductor components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an apparatus including a cooling structure and a method for operating the apparatus. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 1:
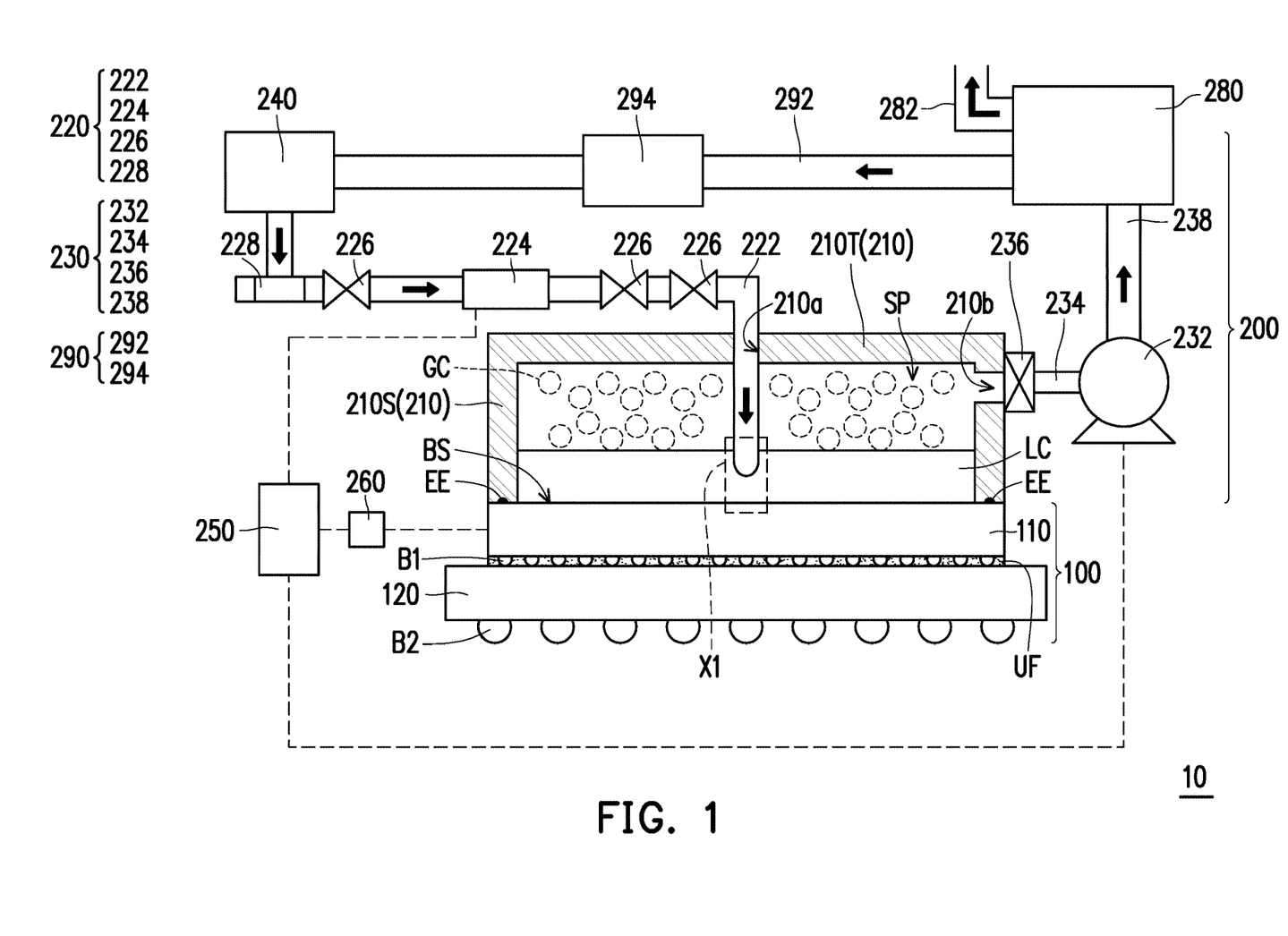
FIG. 1 schematically illustrates an apparatus in accordance with some embodiments of the present disclosure.

FIG. 1 schematically illustrates an apparatus in accordance with some embodiments of the present disclosure. Referring to FIG. 1, the apparatus 10 in accordance with some embodiments of the present disclosure may include a semiconductor component 100 and a cooling structure 200 over a back side BS of the semiconductor component 100. In some embodiments, the semiconductor component 100 may be or may include any type of semiconductor devices, such as a semiconductor chip or a semiconductor package. For example, the semiconductor component 100 may include a semiconductor chip 110, which may be singulated from a device wafer (not shown). The semiconductor chip 110 may be or may include a logic die, such as a central processing unit (CPU) die, a graphic processing unit (GPU) die, a micro control unit (MCU) die, an input-output (I/O) die, a memory die, a baseband (BB) die, an application processor (AP) die, or the like. In some embodiments, the semiconductor chip 110 may include a semiconductor substrate (not individually illustrated) and a plurality of devices (not individually illustrated) formed in or on the semiconductor substrate. In some embodiments, the semiconductor substrate is made of silicon or other semiconductor materials. In some alternative embodiments, the semiconductor substrate includes other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the devices may be integrated circuit (IC) devices. The integrated circuit (IC) devices may be or may include active devices (e.g., transistors or the like) and, optionally, passive devices (e.g., resistors, capacitors, inductors, or the like) to generate the desired functional requirements for the semiconductor chip 110. Besides, the semiconductor chip 110 may further include an interconnect structure (not individually illustrated) disposed on the semiconductor substrate. The interconnect structure may be electrically connected to various devices to form functional circuits within the semiconductor chip 110.

In some embodiments, the semiconductor component 100 further includes a substrate 120, and the semiconductor chip 110 is mounted onto and electrically connected to the substrate 120 through a plurality of conductive bumps B1, so as to form a semiconductor package. In some embodiments, the substrate 120 may include an interposer, a package substrate and/or the like. In some embodiments, the conductive bumps B1 may be controlled collapse chip connection (C4) bumps, micro-bumps, solder balls, ball grid array (BGA) balls, or other suitable conductive terminals. Besides, in some embodiments, an underfill UF may be formed between the semiconductor chip 110 and the substrate 120 so as to laterally encapsulate the conductive bumps B1. The underfill UF may protect the conductive bumps B1 from fatigue and may enhance bonding reliability between the semiconductor chip 110 and the substrate 120. In some alternative embodiments, the formation of the underfill UF may be omitted. Furthermore, the substrate 120 may include a plurality of conductive bumps B2 for external connections to the semiconductor component 100. Other possible forms and shapes of the conductive bumps B1 and B2 may be utilized according to design requirements.

Still referring to FIG. 1, the cooling structure 200 includes a housing 210, a liquid delivery device 220 and a gas exhaust device 230. In some embodiments, the housing 210 includes a cooling space SP adjacent to the semiconductor component 100. In some embodiments, the liquid delivery device 220 is connected to an inlet 210a of the housing 210, and the gas exhaust device 230 is connected to an outlet 210b of the housing 210. In some embodiments, the housing 210 includes a top portion 210T and a sidewall portion 210S connected to the top portion 210T. In some embodiments, the top portion 210T of the housing 210 includes the inlet 210a of the housing 210. In some embodiments, the sidewall portion 210S of the housing 210 includes the outlet 210b of the housing 210.

In some embodiments, the housing 210 of the cooling structure 200 abuts on the back side BS of the semiconductor component 100 to form the cooling space SP between the housing 210 and the semiconductor component 100. In other words, the cooling space SP is defined by the housing 210 and the back side BS of the semiconductor component 100, wherein the liquid coolant LC in the cooling space SP is in contact with the back side BS of the semiconductor component 100. Here, the back side BS of the semiconductor component 100 is referred to as the back side BS of the semiconductor chip 110. To facilitate the assembling of the cooling structure 200, a plurality of elastic elements EE may be utilized. For example, the elastic elements EE are installed between the sidewall portion 210S of the housing 210 and the semiconductor component 100 to seal the gap between the sidewall portion 210S of the housing 210 and the semiconductor component 100 so as to prevent the liquid coolant LC from leaking. In some embodiments, the elastic elements EE may be O-rings sandwiched between the sidewall portion 210S of the housing 210 and the back side BS of the semiconductor component 100. In some embodiments, the material of the elastic elements EE may be rubber or other suitable elastic material.

In some embodiments, the liquid delivery device 220 is configured to deliver a liquid coolant LC into the cooling space SP from the inlet 210a. In some embodiments, the liquid coolant LC includes water ($H_2O$). However, other possible kinds of the liquid coolant LC may be utilized. In some embodiments, the liquid delivery device 220 may include a delivery pipe 222, a liquid controller 224, a plurality of valves 226 and a filter 228. In some embodiments, the cooling structure 200 further includes a liquid supplying device 240 to supply the liquid coolant LC, and the delivery pipe 222 may be physically connected between the liquid supplying device 240 and the inlet 210a of the housing 210 such that the liquid coolant LC may be delivered from the liquid supplying device 240 to the cooling space SP of the housing 210 through the delivery pipe 222. In some embodiments, the liquid supplying device 240 may provide fresh liquid coolant LC to the cooling space SP. In some alternative embodiments, the liquid supplying device 240 may deliver recycled liquid coolant LC to the cooling space SP, and the detail explanations will be discussed later. In some embodiments, the liquid controller 224 and the plurality of valves 226 may be disposed on a flow path of the delivery pipe 222 to control a flowrate of the liquid coolant LC delivered by the liquid delivery device 220. For example, the liquid controller 224 may be a mass flow controller (MFC) used to measure and control the flowrate the liquid coolant LC. The valves 226 may be needle valves, or any type of on-off valve that may be opened or closed to allow liquid to pass through or block liquid from passing through. In some embodiments, the filter 228 is disposed on a flow path of the delivery pipe 222 to filter out impurities (such as particles, dust, etc.) from the liquid coolant LC. In some embodiments, the filter 228 is disposed between the liquid supplying device 240 and the liquid controller 224.

In some embodiments, the gas exhaust device 230 is configured to lower a pressure in the housing 210. In some embodiments, the pressure in the housing 210 is kept lower than 760 torr (1 atm). In some embodiments, the gas exhaust device 230 may include a pump 232, a pumping port 234 and a gate 236. In some embodiments, the pump 232 is in controllable communication with the cooling space SP of the housing 210. In some embodiments, the pump 232 is capable of evacuating gas from the cooling space SP through the pumping port 234 connected between the outlet 210b of the housing 210 and the pump 232, so as to maintain specific pressure inside the cooling space SP of the housing 210. In some embodiments, the pump 232 may have a power range from about 50 W to about 8500 W. In some embodiments, the flowrate of the pump 232 may range from about 20000 standard cubic centimeters per minute (sccm) to about 90000000 standard cubic centimeters per minute (sccm). In some embodiments, the volume of the cooling space SP may range from about 10 $cm^3$ to about 10000 $cm^3$. In some embodiments, the gate 236 is connected between the outlet 210b of the housing 210 and the pumping port 234 to allow gas to pass through or block gas from passing through and/or control a flowrate of the gas pumped out by the pump 232 of the gas exhaust device 230.

Specifically, when the apparatus 10 is operated, the temperature of the semiconductor component 100 may be raised, and the liquid coolant LC in the cooling space SP may be heated by the semiconductor component 100. On the other hand, the gas exhaust device 230 evacuates gas from the cooling space SP to lower the pressure in the housing 210, such that a boiling temperature of the liquid coolant LC in the cooling space SP may be decreased, and the liquid coolant LC in the housing 210 may be easier to vaporize (e.g., evaporate or boil). In an embodiment where the liquid coolant LC is water ($H_2O$), when the pressure is lowered from about 760 torr to about 85 torr, the boiling temperature of the liquid coolant LC (water) may be decreased from about 100 Celsius degrees to about 50 Celsius degrees. About 2388 J of heat is required to change 1 gram of water at 50 Celsius degrees to 1 gram of steam at 50 Celsius degrees.

Since vaporization of liquid requires much heat from its surrounding, the heat generated from the semiconductor component 100 may be effectively adsorbed when the liquid coolant LC changes into gas phase (i.e., a gas coolant GS), thereby enhancing the heat dissipation efficiency of the apparatus 10.

In some embodiments, the cooling structure 200 may further includes an exhaust gas treatment device 280, and the gas exhaust device 230 may further include an exhaust pipe 238 connected between the pump 232 and the exhaust gas treatment device 280, such that the gas coolant GS may be delivered from the pump 232 to the exhaust gas treatment device 280 through the exhaust pipe 238. In some embodiments, the exhaust gas treatment device 280 may include a condensation device (not shown) to condense the gas coolant GS into the liquid coolant LC for reuse, and the recycled liquid coolant LC may be delivered to the liquid supplying device 240 through a recycled liquid delivery device 290. In some embodiments, the recycled liquid delivery device 290 may include a delivery pipe 292 and a filter 294. The delivery pipe 292 may be physically connected between the exhaust gas treatment device 280 and the liquid supplying device 240. The filter 294 may be disposed on a flow path of the delivery pipe 292 to filter out impurities (such as particles, dust, etc.) from the recycled liquid coolant LC. However, in some alternative embodiments, the gas coolant GS pumped out by the pump 232 may be discharged by an exhaust pipe 282 of the exhaust gas treatment device 280. In some embodiments, the discharged exhaust gas may be used for heat recycle or may be delivered to an exhaust gas scrubber.

Figure 2:
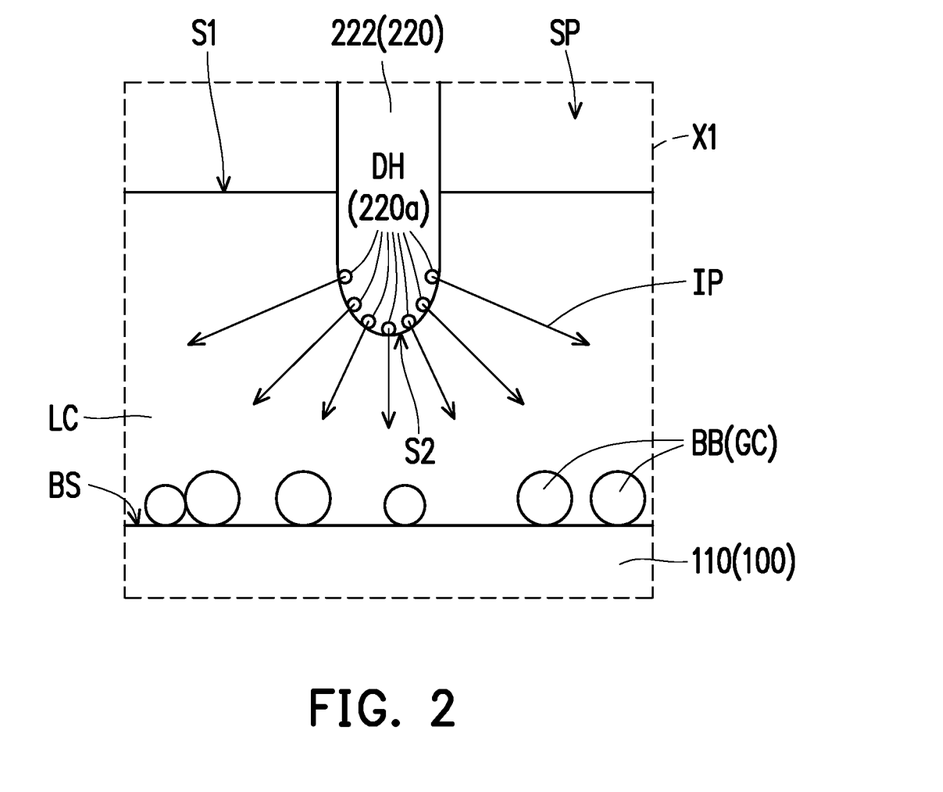
FIG. 2 is an enlarged view of the region X1 illustrated in FIG. 1 in accordance with some embodiments of the present disclosure.

FIG. 2 is an enlarged view of the region X1 illustrated in FIG. 1 in accordance with some embodiments of the present disclosure. Referring to FIG. 1 and FIG. 2, the delivery pipe 222 of the liquid delivery device 220 is connected between the liquid supplying device 240 and the housing 210 and extends into the cooling space SP from the top portion 210T of the housing 210. In some embodiments, the delivery pipe 222 of the liquid delivery device 220 includes a delivery outlet 220a immersed in the liquid coolant LC. In other words, there may be enough liquid coolant LC in the cooling space SP such that the liquid surface S1 of the liquid coolant LC is higher than an end portion of the delivery pipe 222 where the delivery outlet 220a is located. In details, when the liquid coolant LC is heated by the semiconductor component 100, the gaseous coolant GC may be generated on the heated surface (i.e., the back side of the semiconductor component 100) so as to form bubbles BB, and the bubbles BB may accumulate at a bottom of the liquid coolant LC. The accumulation of the bubbles BB of the gaseous coolant GC may hinder the liquid coolant LC from cooling the semiconductor component 100. On the other hand, the delivery of the liquid coolant LC may provide a force to push the bubbles BB of the gaseous coolant GC, so as to remove the bubbles BB of the gaseous coolant GC from the bottom of the liquid coolant LC when the delivery outlet 220a delivers the liquid coolant LC. Therefore, the heat dissipation performance may not be affected by the bubbles BB of the gaseous coolant GC.

Figure 3:
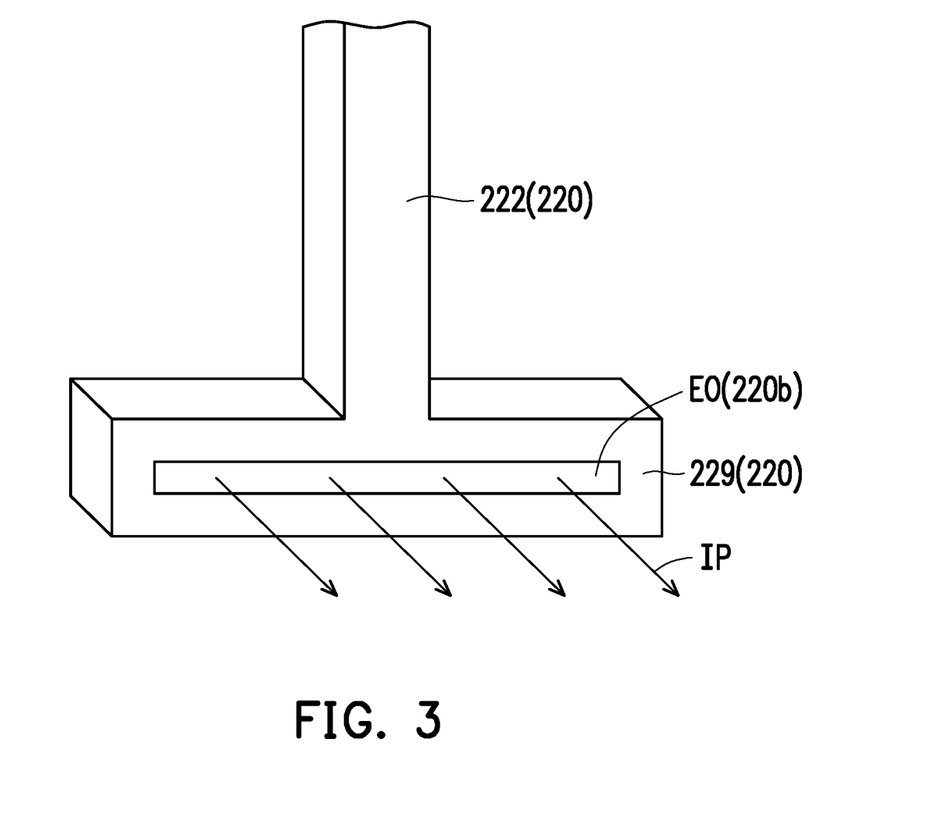
FIG. 3 schematically illustrates a partial enlarged view of a liquid delivery device of the apparatus in accordance with some other embodiments of the present disclosure.

As illustrated in FIG. 2, in some embodiments, the delivery outlet 220a of the liquid delivery device 220 includes a plurality of delivery holes DH, and the delivery holes DH may deliver the liquid coolant LC along multiple injection paths IP. In some embodiments, the end portion of the delivery pipe 222 has a curved surface S2 facing the semiconductor component 100, wherein the curved surface S2 of the end portion of the delivery pipe 222 includes the delivery holes DH. In some embodiments, the liquid coolant LC is sprayed into the housing 210, so as to provide the force to remove the bubbles BB of the gaseous coolant GC. However, other form or shape of the delivery outlet may be adapted as long as the delivery outlet is able to provide enough force to remove the bubbles BB of the gaseous coolant GC from the bottom of the liquid coolant LC. For example, FIG. 3 schematically illustrates a partial enlarged view of a liquid delivery device of the apparatus in accordance with some other embodiments of the present disclosure. As shown in FIG. 3, the liquid delivery device 220 may further includes a head 229 connected to the delivery pipe 222. The head 229 may include a delivery outlet 220b immersed in the liquid coolant LC. The delivery outlet 220b of the liquid delivery device 220 may have an elongated opening EO to deliver the liquid coolant LC. In this case, the delivery pipe 222 and the head 229 may be disposed in proximity to the sidewall portion 210S of the housing 210, and the delivery outlet 220b of the liquid delivery device 220 may deliver the liquid coolant LC along the same injection paths IP from a lateral side of the cooling space SP toward another lateral side of the cooling space SP, so as to remove the bubbles BB of the gaseous coolant GC from the bottom of the liquid coolant LC.

Referring to FIG. 1 again, in some embodiments, the apparatus 10 further include a controller 250 and a sensing device 260. In some embodiments, the controller 250 is communicatively coupled to the sensing device 260. In some embodiments, the sensing device 260 is configured to detect the temperature of the semiconductor component 100, and the controller 250 receives the feedback of the sensing device 260 to modulate the flowrate of the liquid coolant LC delivered by the liquid delivery device 220 and the flowrate of the gaseous coolant GC pumped out by the gas exhaust device 230 according to the detected temperature of the semiconductor component 100. For example, the controller 250 may be communicatively coupled to the liquid controller 224 and/or the valves 226 of the liquid delivery device 220 to modulate the flowrate of the liquid coolant LC delivered by the liquid delivery device 220, and the controller 250 may be communicatively coupled to the pump 232 and/or the gate 236 of the gas exhaust device 230 to modulate the flowrate of the gaseous coolant GC pumped out by the gas exhaust device 230. By the modulation of the controller 250, the cooling space SP of the housing 210 may be maintained at a suitable pressure, and the semiconductor component 100 may be maintained at a suitable operation temperature.

In some embodiments, the flowrate of the liquid coolant LC delivered by the liquid delivery device 220 may range from about 2.3 cubic centimeters per minute to about 2.7 cubic centimeters per minute. In some embodiments, the flowrate of the gaseous coolant GC pumped out by the gas exhaust device 230 may range from about 20000 standard cubic centimeters per minute (sccm) to about 90000000 standard cubic centimeters per minute (sccm).

It should be noted that the semiconductor component 100 in FIG. 1 is illustrated as an example. In other embodiments, the cooling structure 200 is utilized for other types of semiconductor components, and some exemplary embodiments will be discussed in the following FIG. 4 through FIG. 7.

FIG. 4 through FIG. 7 schematically illustrates various apparatuses in accordance with some other embodiments of the present disclosure.

Figure 4:
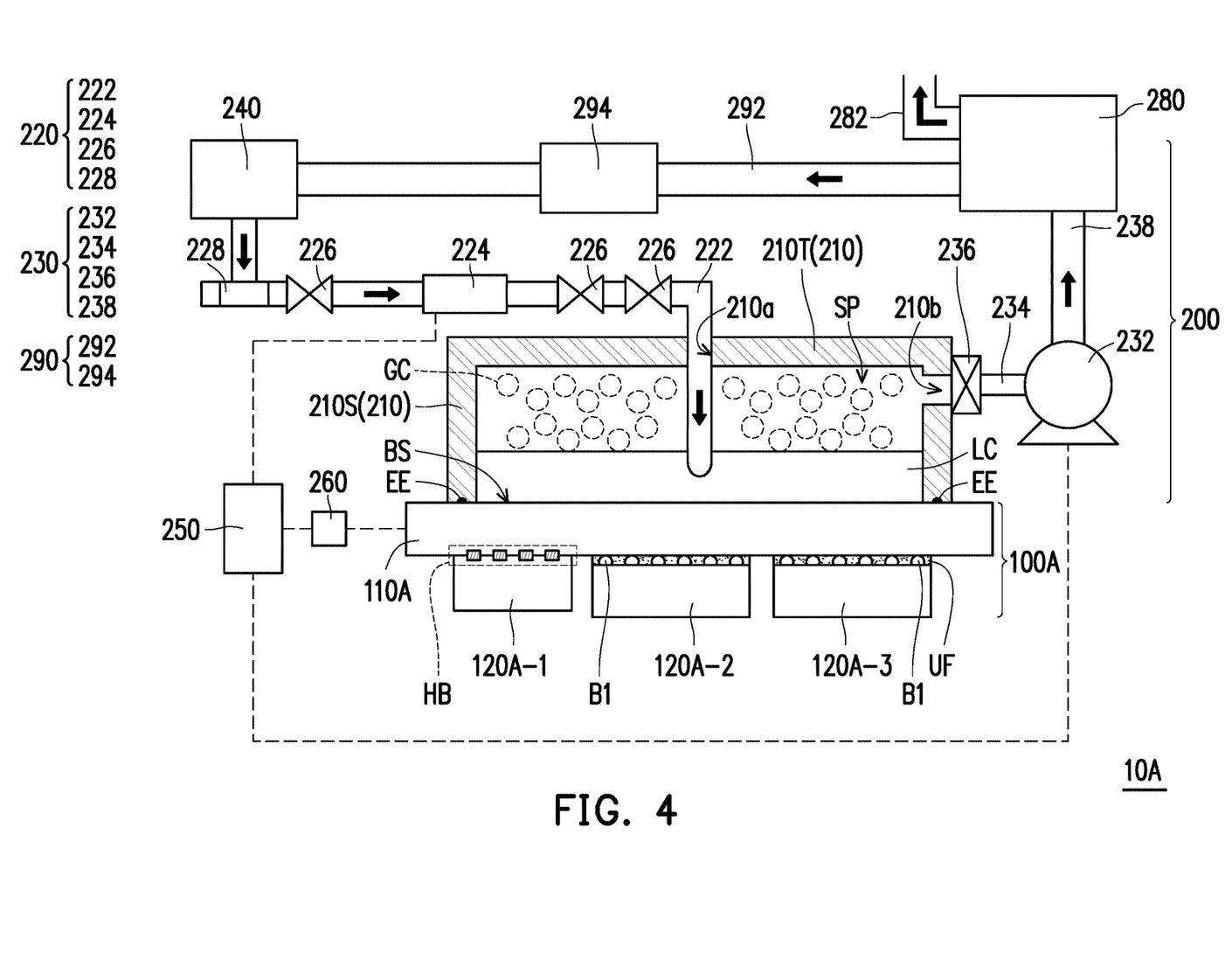
FIG. 4 through FIG. 7 schematically illustrates various apparatuses in accordance with some other embodiments of the present disclosure.

Referring to FIG. 4, the apparatus 10A is similar to the apparatus 10 illustrated in FIG. 1, so the detailed descriptions are not repeated for the sake of brevity. The difference therebetween is the types of the semiconductor components. The semiconductor component 100A in FIG. 4 may include a semiconductor wafer 110A and a plurality of semiconductor chips 120A-1, 120A-2 and 120A-3 electrically connected to the semiconductor wafer 110A. In some embodiments, the semiconductor component 100A is referred to as a system-on-wafer (SoW) package. In some embodiments, the semiconductor wafer 110A is at wafer level, which means that the semiconductor wafer 110A is not sawed into individual chips or packages. In some embodiments, the semiconductor chips 120A-1, 120A-2 and 120A-3 are similar to the semiconductor chip 110 in FIG. 1, so the detailed descriptions are omitted herein. In some embodiments, the semiconductor chips 120A-1, 120A-2 and 120A-3 have the same function or different functions. In some embodiments, the sizes (referred to the height and/or the width) of the semiconductor chips 120A-1, 120A-2 and 120A-3 may be the same or different. Here, the back side BS of the semiconductor component 100A is referred to as the back side BS of the semiconductor wafer 110A.

In some embodiments, the semiconductor chip 120A-1 and the semiconductor wafer 110A are bonded together by a hybrid bonding to form a hybrid bonding structure HB. The hybrid bonding may involve two types of bonding, including metal-to-metal bonding and dielectric-to-dielectric bonding. In some embodiments, the hybrid bonding structure HB includes a first bonding metal layer of the semiconductor wafer 110A and a second bonding metal layer of the semiconductor chip 120A-1 bonded by metal-to-metal bonding, as well as a first bonding dielectric layer of the semiconductor wafer 110A and a second bonding dielectric layer of the semiconductor chip 120A-1 bonded by dielectric-to-dielectric bonding. In some embodiments, the semiconductor chips 120A-2 and 120A-3 are electrically connected to the semiconductor wafer 110A through the plurality of conductive bumps B1. In some embodiments, the conductive bumps B1 may be controlled collapse chip connection (C4) bumps, micro-bumps, solder balls, ball grid array (BGA) balls, or other suitable conductive terminals. Besides, in some embodiments, an underfill UF may be formed between the semiconductor wafer 110A and the semiconductor chips 120A-2 and 120A-3 so as to laterally encapsulate the conductive bumps B1. In some alternative embodiments, the formation of the underfill UF may be omitted.

Figure 5:
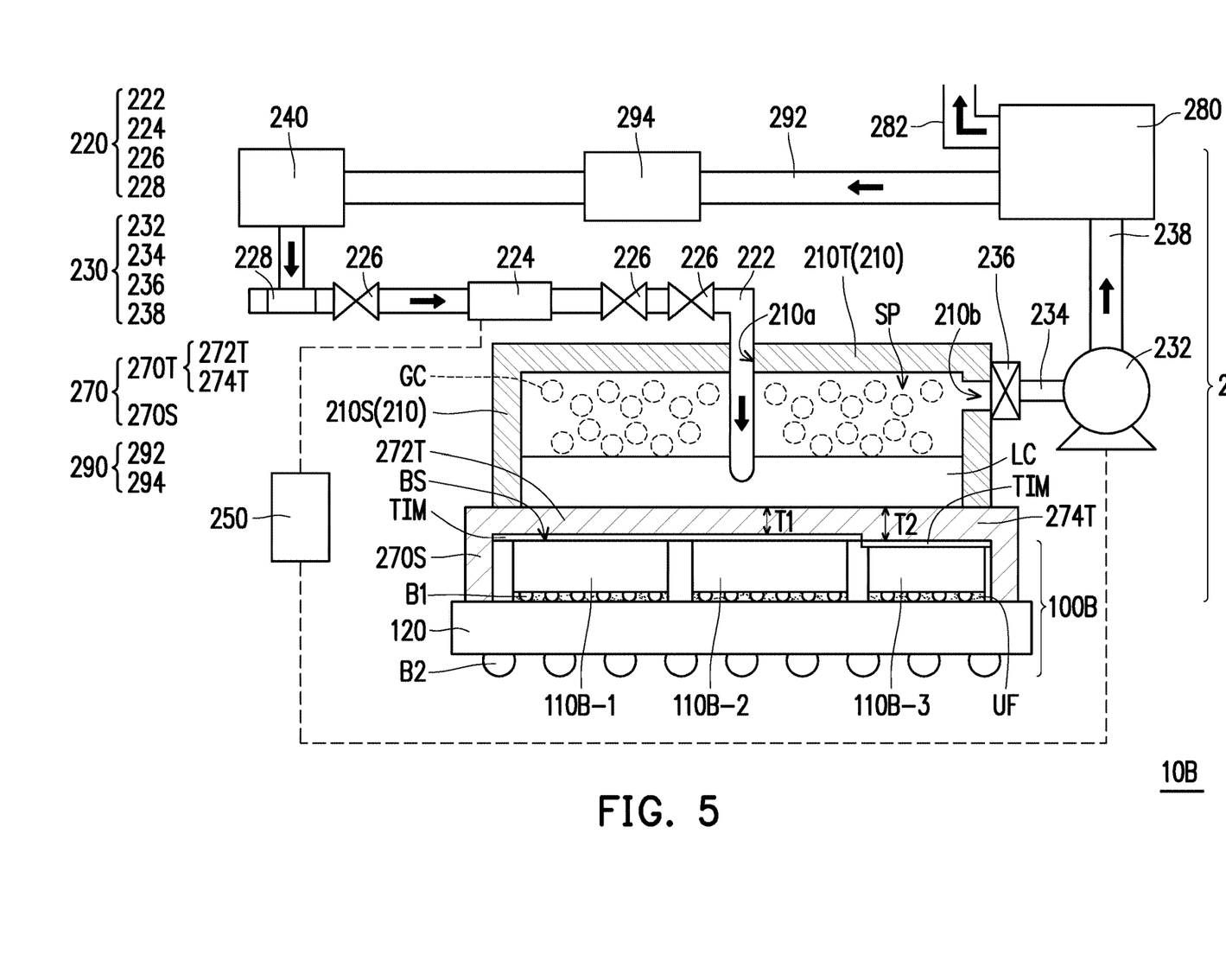

Referring to FIG. 5, the apparatus 10B is similar to the apparatus 10 illustrated in FIG. 1, so the detailed descriptions are not repeated for the sake of brevity. The difference therebetween is the types of the semiconductor components. The semiconductor component 100B in FIG. 5 may include a plurality of semiconductor chip 110B-1, 110B-2 and 110B-3 mounted onto and electrically connected to the substrate 120. Besides, the cooling structure 200 further includes a heat spreader 270 disposed between the housing 210 and the semiconductor component 100B. In some embodiments, the semiconductor chips 110B-1, 110B-2 and 110B-3 are similar to the semiconductor chip 110 in FIG. 1, so the detailed descriptions are omitted herein. In some embodiments, the semiconductor chips 110B-1, 110B-2 and 110B-3 have the same function or different functions. In some embodiments, the sizes (referred to the height and/or the width) of the semiconductor chips 110B-1, 110B-2 and 110B-3 may be the same or different. Here, the back side BS of the semiconductor component 100B is referred to as the back sides BS of the semiconductor chips 110B-1, 110B-2 and 110B-3.

In some embodiments, the housing 210 of the cooling structure 200 abuts on the heat spreader 270 to form the cooling space SP between the housing 210 and the heat spreader 270. In other words, the cooling space SP is defined by the housing 210 and a top surface 270a of the heat spreader 270, wherein the liquid coolant LC in the cooling space SP is in contact with the top surface 270a of the heat spreader 270. In some embodiments, the material of the heat spreader 270 includes copper or other suitable metallic materials. In some embodiments, the heat spreader 270 is attached to the back side BS of the semiconductor component 100B through a thermal interface material TIM. In some embodiments, the heat spreader 270 includes a top portion 270T and a sidewall portion 270S connected to the top portion 270T. In some embodiments, the sidewall portion 210S of the housing 210 abuts on the top portion 270T of the heat spreader 270, and the sidewall portion 270S of the heat spreader 270 abuts on the substrate 120. In some embodiments, the top portion 270T of the heat spreader 270 includes a first segment 272T and a second segment 274T having different thicknesses. In detail, the heights of the semiconductor chips 110B-1 and 110B-2 may be greater than the height of the semiconductor chip 110B-3. In other words, the back sides BS of the semiconductor chips 110B-1 and 110B-2 may be higher than the back side BS of the semiconductor chip 110B-3, such that the first segment of the top portion 270T of the heat spreader 270 directly over the semiconductor chips 110B-1 and 110B-2 may be designed to have a first thickness T1, and the second segment of the top portion 270T of the heat spreader 270 directly over the semiconductor chip 110B-3 may be designed to have a second thickness T2 greater than the first thickness T1. However, in some alternative embodiments, the back side of the semiconductor component may be coplanar and the top portion of the heat spreader may have the same thickness.

Figure 6:
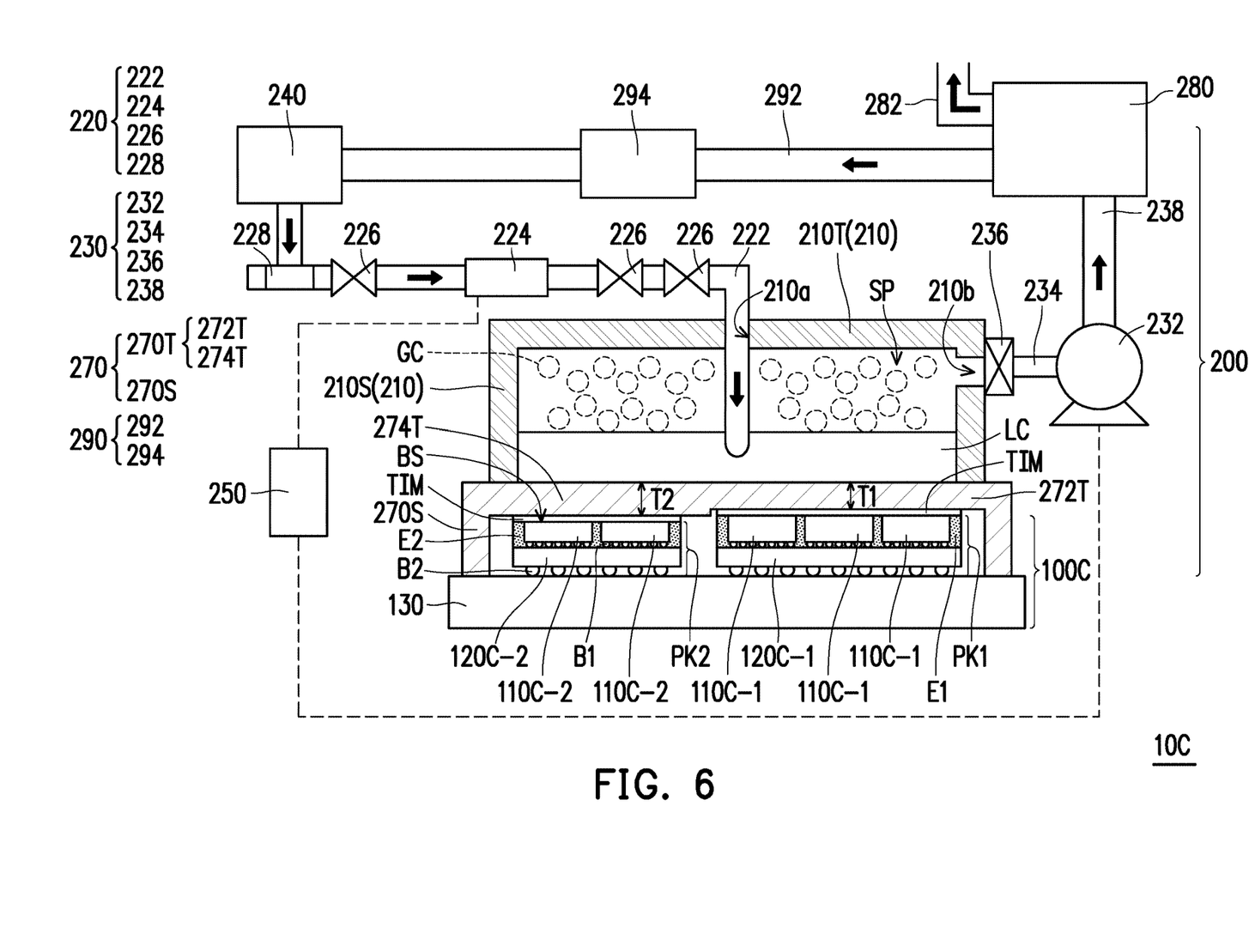

Referring to FIG. 6, the apparatus 10C is similar to the apparatus 10B illustrated in FIG. 5, so the detailed descriptions are not repeated for the sake of brevity. The difference therebetween is the types of the semiconductor components. The semiconductor component 100C in FIG. 6 may include a first package PK1, a second package PK2, and a circuit carrier 130. In some embodiments, the first package PK1 includes a plurality of semiconductor chips 110C-1, a substrate 120C-1 and an insulating encapsulant E1, wherein the semiconductor chips 110C-1 are mounted onto and electrically connected to the substrate 120C-1 through the plurality of conductive bumps B1, and the insulating encapsulant E1 is formed on the substrate 120C-1 to laterally encapsulate the semiconductor chips 110C-1. In some embodiments, the second package PK2 includes a plurality of semiconductor chips 110C-2, a substrate 120C-2 and an insulating encapsulant E2, wherein the semiconductor chips 110C-2 are mounted onto and electrically connected to the substrate 120C-2 through the plurality of conductive bumps B1, and the insulating encapsulant E2 is formed on the substrate 120C-2 to laterally encapsulate the semiconductor chips 110C-2. In some embodiments, the first package PK1 and the second package PK2 are mounted onto and electrically connected to the circuit carrier 130 through the plurality of conductive bumps B2. In some embodiments, the circuit carrier 130 may include a printed circuit board (PCB), a mother board, and/or the like. In some embodiments, the semiconductor chips 110C-1 and 110C-2 are similar to the semiconductor chip 110 in FIG. 1, and the substrate 120C-1 and 120C-2 are similar to the substrate 120 in FIG. 1, so the detailed descriptions are omitted herein. In some embodiments, the first package PK1 and the second package PK2 have the same function or different functions. In some embodiments, the sizes (referred to the height and/or the width) of the first package PK1 and the second package PK2 may be the same or different. Here, the back side BS of the semiconductor component 100C is referred to as the back sides BS of the first package PK1 and the second package PK2.

In some embodiments, the sidewall portion 270S of the heat spreader 270 abuts on the circuit carrier 130. In some embodiments, the top portion 270T of the heat spreader 270 includes a first segment 272T and a second segment 274T having different thicknesses. In detail, the height of the first package PK1 may be greater than the height of the second package PK2. In other words, the back side BS of the first package PK1 may be higher than the back side BS of the second package PK2, such that the first segment 272T of the top portion 270T of the heat spreader 270 directly over the first package PK1 may be designed to have a first thickness T1, and the second segment 274T of the top portion 270T of the heat spreader 270 directly over the second package PK2 may be designed to have a second thickness T2 greater than the first thickness T1. However, in some alternative embodiments, the back side of the semiconductor component may be coplanar and the top portion of the heat spreader may have the same thickness.

Figure 7:
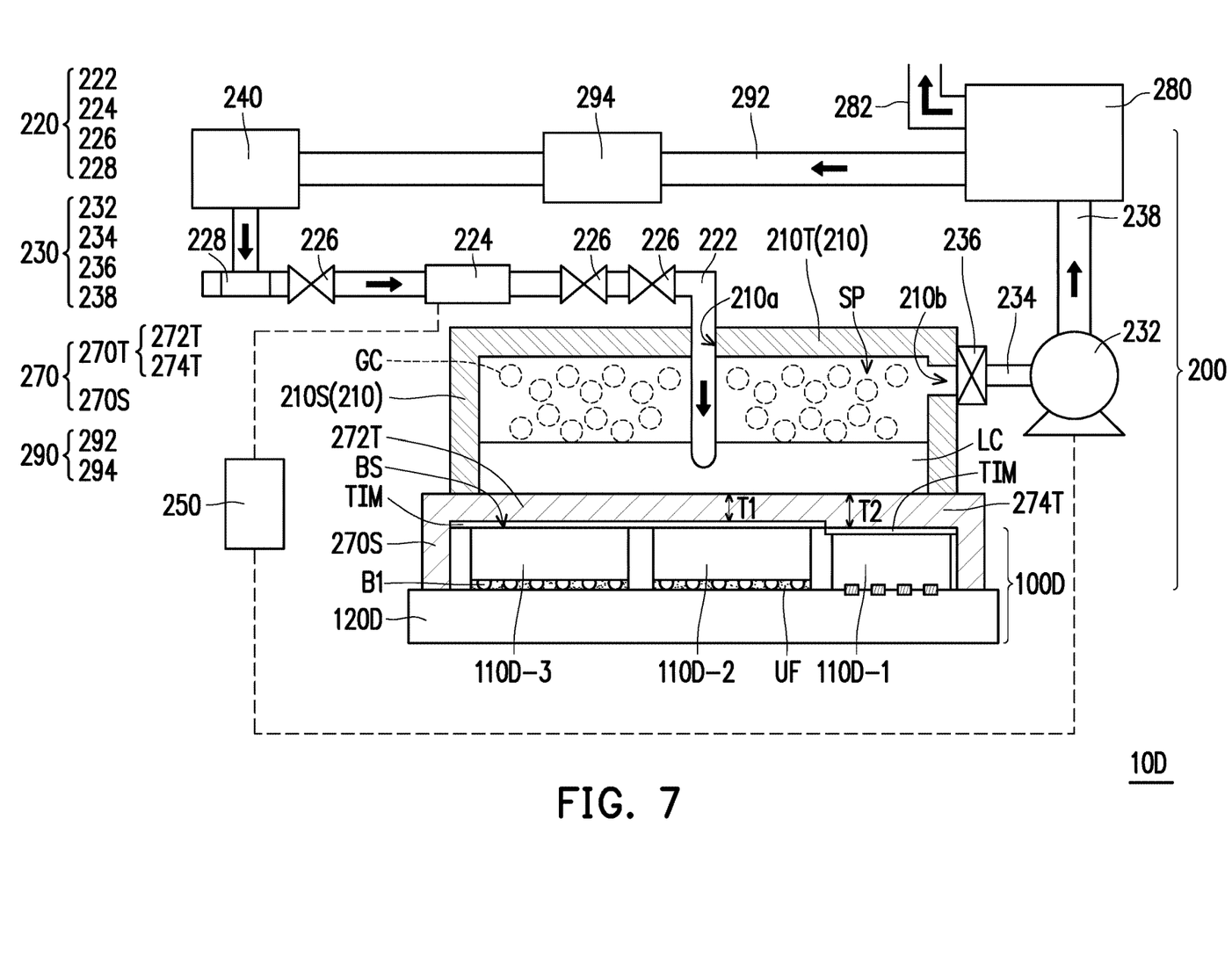

Referring to FIG. 7, the apparatus 10D is similar to the apparatus 10B illustrated in FIG. 5, so the detailed descriptions are not repeated for the sake of brevity. The difference therebetween is the types of the semiconductor components. The semiconductor component 100D in FIG. 7 may include a plurality of semiconductor chips 110D-1, 110D-2 and 110D-3 and a semiconductor wafer 120D electrically connected to the semiconductor chips 110D-1, 110D-2 and 110D-3. In some embodiments, the semiconductor component 100D is similar to the semiconductor component 100A in FIG. 4, and the detailed description is thus omitted herein. Here, the back side BS of the semiconductor component 100D is referred to as the back sides BS of the semiconductor chips 110D-1, 110D-2 and 110D-3.

In some embodiments, the sidewall portion 270S of the heat spreader 270 abuts on the semiconductor wafer 120D. In some embodiments, the top portion 270T of the heat spreader 270 includes a first segment 272T and a second segment 274T having different thicknesses. In detail, the heights of the semiconductor chips 110D-2 and 110D-3 may be greater than the height of the semiconductor chip 110D-1. In other words, the back sides BS of the semiconductor chips 110D-2 and 110D-3 may be higher than the back side BS of the semiconductor chip 110D-1, such that the first segment 272T of the top portion 270T of the heat spreader 270 directly over the semiconductor chips 110D-2 and 110D-3 may be designed to have a first thickness T1, and the second segment 274T of the top portion 270T of the heat spreader 270 directly over the semiconductor chip 110D-1 may be designed to have a second thickness T2 less than the first thickness T1. However, in some alternative embodiments, the back side of the semiconductor component may be coplanar and the top portion of the heat spreader may have the same thickness.

Figure 8:
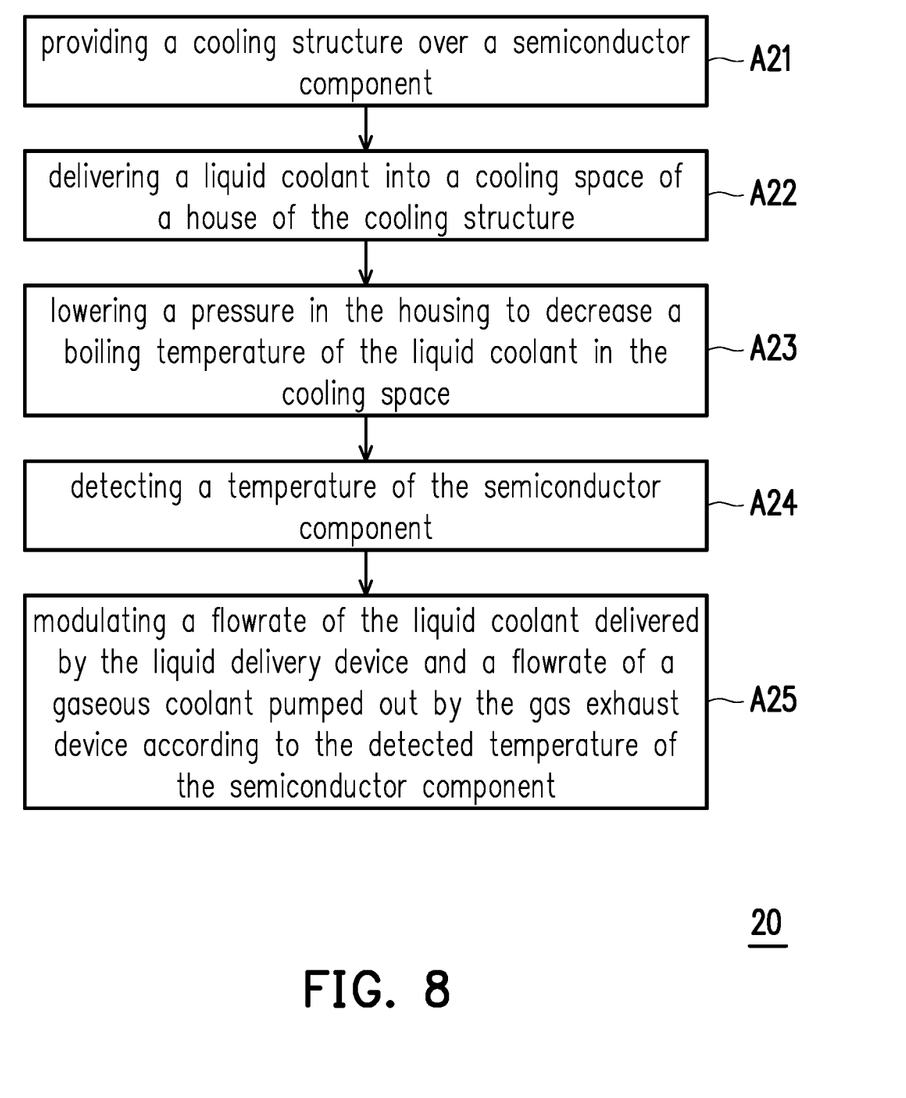
FIG. 8 is a flow chart of a method for operating an apparatus in accordance with some embodiments.

FIG. 8 is a flow chart of a method 20 for operating an apparatus in accordance with some embodiments. Although the method 20 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act A21, a cooling structure is provided over a semiconductor component. FIG. 1 and FIG. 4 to FIG. 7 illustrate the cooling structure 200 and various exemplary semiconductor components 10, 10A, 10B, 10C and 10D. In some embodiments, the cooling structure 200 includes the housing 210 including the cooling space SP adjacent to the semiconductor component (e.g., the semiconductor component 100, 100A, 100B, 100C or 100D), the liquid delivery device 220 connected to the inlet 210a of the housing 210, and the gas exhaust device 230 connected to the outlet 210b of the housing 210. In some embodiments, the liquid delivery device 220 is configured to deliver the liquid coolant LC into the cooling space SP from the inlet 210a, and the gas exhaust device 230 is configured to lower the pressure in the housing 210. In some embodiments, the heat spreader 270 is provided between the housing 210 and the semiconductor component (e.g., the semiconductor component 100B, 100C or 100D).

At act A22, a liquid coolant is delivered into a cooling space of a house of the cooling structure. FIG. 1 and FIG. 4 to FIG. 7 illustrate that the liquid coolant LC is delivered into the cooling space SP of the house 210 of the cooling structure 200 by the liquid delivery device 220.

At act A23, a pressure in the housing is lowered to decrease a boiling temperature of the liquid coolant in the cooling space. FIG. 1 and FIG. 4 to FIG. 7 illustrate that the gas in cooling space SP is evacuated by the gas exhaust device 230 so as to lower the pressure in the housing 210.

At act A24, a temperature of the semiconductor component is detected. FIG. 1 and FIG. 4 illustrate the sensing device 260 configured to detect the temperature of the semiconductor component (e.g., the semiconductor component 100, 100A). Although FIG. 5 to FIG. 7 do not illustrate the sensing device 260, the apparatuses 10B, 10C and/or 10C may also include the sensing device 260 to detect the temperature of the semiconductor component (e.g., the semiconductor component 100B, 100C or 100D).

At act A25, a flowrate of the liquid coolant delivered by the liquid delivery device and a flowrate of a gaseous coolant pumped out by the gas exhaust device are modulated according to the detected temperature of the semiconductor component. FIG. 1 and FIG. 4 to FIG. 7 illustrate the controller 250 communicatively coupled to the sensing device 260, the liquid delivery device 220 and the gas exhaust device 230. In some embodiments, the controller 250 is configured to modulate the flowrate of the liquid coolant LC delivered by the liquid delivery device 220 and the flowrate of the gaseous coolant GC pumped out by the gas exhaust device 230 according to the detected temperature of the semiconductor component (e.g., the semiconductor component 100, 100A, 100B, 100C or 100D) to keep the pressure in the housing 210 lower than 760 torr.

In some embodiments, the sequence of acts A22, A23, A24 and A25 may be exchanged as needed. In some embodiments, some of acts A22, A23, A24 and A25 may be performed at the same time. For example, when the apparatus (e.g., the apparatus 10, 10A, 10B, 10C or 10D) is operated at the beginning, act A22 is performed to deliver the liquid coolant LC into the cooling space SP. Then, act A23 is performed to lower the pressure in the cooling space SP, such that the boiling temperature of the liquid coolant LC is lowered. Subsequently, the gas gaseous coolant GC is vaporized from the liquid coolant LC when the liquid coolant LC is heated by the semiconductor component (e.g., the semiconductor component 100, 100A, 100B, 100C or 100D), such that the pressure in the housing 210 increases. Thereafter, act A22 and/or act A23 may be performed again to newly add the liquid coolant LC into the cooling space SP and/or evacuate the gas gaseous coolant GC from the cooling space SP to maintain the specific pressure inside the cooling space SP of the housing 210. Besides, act A23 and/or A24 may be performed before and/or after act A21 and/or A22.

In accordance with some embodiments of the disclosure, an apparatus includes a semiconductor component and a cooling structure. The cooling structure is over a back side of the semiconductor component. The cooling structure includes a housing, a liquid delivery device and a gas exhaust device. The housing includes a cooling space adjacent to the semiconductor component. The liquid delivery device is connected to an inlet of the housing and is configured to deliver a liquid coolant into the cooling space from the inlet. The gas exhaust device is connected to an outlet of the housing and is configured to lower a pressure in the housing.

In accordance with some embodiments of the disclosure, a method includes the following steps. A cooling structure is provided over a semiconductor component, wherein the cooling structure including a housing including a cooling space adjacent to the semiconductor component, a liquid delivery device connected to an inlet of the housing, and a gas exhaust device connected to an outlet of the housing. A liquid coolant is delivered into the cooling space from the inlet by the liquid delivery device. A pressure in the housing is lowered by the gas exhaust device to decrease a boiling temperature of the liquid coolant in the cooling space.

In accordance with some embodiments of the disclosure, a method includes the following steps. A cooling structure is provided over a semiconductor component, wherein the cooling structure including a housing including a cooling space adjacent to the semiconductor component, a liquid delivery device connected to an inlet of the housing and configured to deliver a liquid coolant into the cooling space from the inlet, and a gas exhaust device connected to an outlet of the housing and configured to lower a pressure in the housing. According to a detected temperature of the semiconductor component, a flowrate of the liquid coolant delivered by the liquid delivery device and a flowrate of a gaseous coolant pumped out by the gas exhaust device are modulated to keep the pressure in the housing lower than 760 torr, wherein the gaseous coolant is vaporized from the liquid coolant when the liquid coolant is heated by the semiconductor component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a cooling structure over a semiconductor component, the cooling structure comprising a housing comprising a cooling space adjacent to the semiconductor component, a liquid delivery device connected to an inlet of the housing and configured to deliver a liquid coolant into the cooling space from the inlet, and a gas exhaust device connected to an outlet of the housing and configured to lower a pressure in the housing; and
   according to a detected temperature of the semiconductor component, modulating a flowrate of the liquid coolant delivered by the liquid delivery device and a flowrate of a gaseous coolant pumped out by the gas exhaust device to keep the pressure in the housing lower than 760 torr, wherein the gaseous coolant is vaporized from the liquid coolant when the liquid coolant is heated by the semiconductor component.

2. The method as claimed in claim 1, wherein the housing of the cooling structure abuts on a back side of the semiconductor component to form the cooling space between the housing and the semiconductor component.

3. The method as claimed in claim 2, wherein the liquid coolant in the cooling space is in contact with the back side of the semiconductor component.

4. The method as claimed in claim 1, further comprising:
   providing a heat spreader between the housing and the semiconductor component, wherein the housing of the cooling structure abuts on the heat spreader to form the cooling space between the housing and the heat spreader.

5. The method as claimed in claim 4, wherein the heat spreader is attached to a back side of the semiconductor component through a thermal interface material.

6. The method as claimed in claim 1, wherein the liquid delivery device extends into the cooling space from a top portion of the housing and includes a delivery outlet immersed in the liquid coolant, so that bubbles of the gaseous coolant are removed from a bottom of the liquid coolant when the delivery outlet delivers the liquid coolant.

* * * * *